United States Patent
Hirata et al.

(10) Patent No.: US 7,767,302 B2
(45) Date of Patent: Aug. 3, 2010

(54) PITCH-BASED CARBON FIBER, WEB AND RESIN MOLDED PRODUCT CONTAINING THEM

(75) Inventors: Masumi Hirata, Iwakuni (JP); Hiroshi Hara, Iwakuni (JP); Tetsuo Ban, Iwakuni (JP)

(73) Assignee: Teijin Limited, Osaka (JP)

( * ) Notice: Subject to any disclaimer, the term of this patent is extended or adjusted under 35 U.S.C. 154(b) by 0 days.

(21) Appl. No.: 12/622,999

(22) Filed: Nov. 20, 2009

(65) Prior Publication Data

US 2010/0068496 A1 Mar. 18, 2010

Related U.S. Application Data

(62) Division of application No. 11/911,912, filed as application No. PCT/JP2006/308250 on Apr. 13, 2006, now Pat. No. 7,651,767.

(30) Foreign Application Priority Data

Apr. 18, 2005 (JP) .............................. 2005-119537
May 30, 2005 (JP) .............................. 2005-156894

(51) Int. Cl.
*B32B 9/00* (2006.01)
(52) U.S. Cl. ....................... 428/408; 428/367; 428/220; 423/447.1; 423/447.2
(58) Field of Classification Search ................. 428/220, 428/367, 408; 423/447.1, 447.2
See application file for complete search history.

(56) References Cited

U.S. PATENT DOCUMENTS 4,354,886 A * 10/1982 Bergersen .................... 156/50
5,236,687 A * 8/1993 Fukuda et al. ........... 423/447.2
5,283,113 A 2/1994 Nishimura et al.
5,338,320 A * 8/1994 Fukuda et al. ............. 29/623.1
5,543,211 A 8/1996 Gallagher
5,652,058 A * 7/1997 Nagata et al. ............... 428/378
5,968,650 A * 10/1999 Tennent et al. .............. 428/367
6,303,095 B1 10/2001 Nishimura et al.
6,787,229 B1 * 9/2004 Muradov .................... 428/367
6,855,398 B1 2/2005 Machino et al.
7,390,476 B2 6/2008 Ko et al.
7,438,970 B2 10/2008 Magrio et al.
7,476,439 B2 * 1/2009 Komori et al. ........... 428/293.4
7,651,767 B2 * 1/2010 Hirata et al. ................ 428/367
2005/0159062 A1 7/2005 Machino
2008/0152906 A1 * 6/2008 Kobayashi et al. .......... 428/367
2009/0061193 A1 * 3/2009 Hara et al. .................. 428/220
2009/0075054 A1 3/2009 Hirata et al.
2010/0068496 A1 * 3/2010 Hirata et al. ............. 428/293.4

FOREIGN PATENT DOCUMENTS

| JP | 5-195396 A | 8/1993 |
| JP | 2002-285457 A | 10/2002 |
| JP | 2004-176236 A | 6/2004 |
| JP | 2006-104643 A | 4/2006 |
| WO | 98/38140 A1 | 9/1998 |
| WO | 2005-045115 A1 | 5/2005 |

* cited by examiner

*Primary Examiner*—N. Edwards
(74) *Attorney, Agent, or Firm*—Sughrue Mion, PLLC

(57) ABSTRACT

To provide a carbon fiber reinforcement having excellent thermal conductivity and mechanical properties which is manufactured by mixing together two different types of pitch-based carbon short fibers having a ratio of the degree of filament diameter distribution to average fiber diameter of 0.05 to 0.2 and a fiber length of 20 to 6,000 μm which differ from each other in average fiber diameter or by mixing one of them with a pitch-based carbon fiber web to improve dispersibility into a matrix resin or increase the dispersion ratio of the pitch-based carbon short fibers.

10 Claims, No Drawings

PITCH-BASED CARBON FIBER, WEB AND RESIN MOLDED PRODUCT CONTAINING THEM

CROSS REFERENCE TO RELATED APPLICATIONS

This is a divisional application of U.S. application Ser. No. 11/911,912 filed Jun. 20, 2008, which is a National Stage of International Application No. PCT/JP2006/308250 filed on Apr. 13, 2006, claiming priority based on Japanese Patent Application Nos. 2005-119537 and 2005-156894, filed Apr. 18, 2005, and May 30, 2005, the contents of all of which are incorporated herein by reference in their entirety.

TECHNICAL FIELD

The present invention relates to a mixture of pitch-based carbon short fibers having different fiber diameters, a carbon fiber web containing pitch-based carbon short fibers, a reinforced resin molded product containing them, and use of the molded product.

BACKGROUND ART

High-performance carbon fibers can be classified into PAN-based carbon fibers obtained from polyacrylonitrile (PAN) and pitch-based carbon fibers obtained from pitches. Carbon fibers are widely used in aerospace, construction and civil engineering, and sport and leisure applications, making use of their feature that they have much higher strength and elastic modulus than ordinary synthetic polymers.

While much attention is now paid to methods for making efficient use of energy, typified by energy saving, the generation of Joule heat from high-speed CPU's and electronic circuits is becoming an issue. To solve these, the efficient processing of heat, so-called "thermal management" must be attained.

Although carbon fibers have a higher thermal conductivity than ordinary synthetic polymers in general, the further improvement of thermal conductivity is now under study. Commercially available PAN-based carbon fibers generally have a thermal conductivity lower than 200 W/(m·K). In contrast to this, it is perceived that pitch-based carbon fibers easily attain a higher thermal conductivity than PAN-based carbon fibers.

However, to make carbon fibers actually function as a thermal conductive material, the thermal conductivity of a molded product of the carbon fibers must be improved. To make thermal conduction equal three-dimensionally, a filler which mainly serves to conduct heat must form a three-dimensional network. For example, in the case of a spherical filler which is uniform in size, the network of the filler contained in a molded product behaves like percolation when it is dispersed uniformly though this depends on the dispersion state of the filler. Therefore, in order to obtain a sufficiently high thermal conductivity and electric conductivity, a certain amount or more of a filler must be added. However, it is extremely difficult to disperse a medium and a filler in a concentration higher than a certain level in most cases when a molded product is to be formed. Although a composite material composed of a fabric formed of conventionally used fibers and a matrix has an improved thermal conductivity in the in-plane direction, it is hard to say that its thermal conductivity in the thickness direction is satisfactory because carbon fibers cannot form a network completely.

Under the above situation, many attempts have been made to improve the thermal conductivity drastically. JP-A 5-17593 discloses a thermal conductive molded article having high mechanical strength which is manufactured by impregnating carbon fibers drawn in one direction with graphite powders and a thermosetting resin. JP-A 2-242919 discloses that physical properties such as thermal conductivity of a molded product are improved by the improvement of the physical properties of carbon fibers. However, the improvement of the thermal properties of a molded product is not clear therefrom.

Development is under way from the viewpoint of increasing the thermal conductivity of carbon fibers as described above. However, from the viewpoint of thermal management, the thermal conductivity of a molded product must be high. Then, it is desired that carbon short fibers having a suitable thermal conductivity can be controlled to show optimum thermal conduction in a molded product, or a carbon fiber reinforcement which has a suitable thermal conductivity and can increase the content of carbon fibers in a molded product and a carbon fiber reinforced composite material which has an improved 3-D thermal conductivity and excellent mechanical properties are strongly desired.

DISCLOSURE OF THE INVENTION

It is an object of the present invention to provide a pitch-based carbon short fiber mixture which can be dispersed into a molded product at a high packing rate and can provide a molded product having a high thermal conductivity.

It is another object of the present invention to provide a pitch-based carbon fiber web which can be dispersed into a molded product at a high packing rate and can provide a molded product having a high thermal conductivity.

It is still another object of the present invention to provide a carbon fiber reinforced resin molded product containing the above pitch-based carbon short fiber mixture or the above pitch-based carbon fiber web.

It is a further object of the present invention to provide use of the above carbon fiber reinforced resin molded product in a radiator for electronic parts or a heat exchanger.

Other objects and advantages of the present invention will become apparent from the following description.

According to the present invention, firstly, the above objects and advantages of the present invention are attained by a pitch-based carbon short fiber mixture consisting of first pitch-based carbon short fibers having an average fiber diameter of 5 μm or more and less than 10 μm, a ratio of the degree of filament diameter distribution to average fiber diameter of 0.05 to 0.2 and a fiber length of 20 to 6,000 μm and second pitch-based carbon short fibers having an average fiber diameter of 10 to 20 μm, a ratio of the degree of filament diameter distribution to average fiber diameter of 0.05 to 0.2 and a fiber length of 20 to 6,000 wherein the weight ratio of the first pitch-based carbon short fibers to the second pitch-based carbon short fibers is 1:99 to 99:1.

According to the present invention, secondly, the above objects and advantages of the present invention are attained by a carbon fiber web comprising a pitch-based carbon fiber web and pitch-based carbon short fibers having an average fiber diameter of 1 to 20 μm, a ratio of the degree of filament diameter distribution to average fiber diameter of 0.05 to 0.20 and a fiber length of 20 to 6,000 wherein the pitch-based carbon short fibers are dispersed in the voids of the pitch-based carbon fiber web, and the weight ratio of the pitch-based carbon fiber web to the pitch-based carbon short fibers is 30:70 to 95:5.

According to the present invention, thirdly, the above objects and advantages of the present invention are attained by a carbon fiber reinforced resin molded product comprising the above pitch-based carbon short fiber mixture of the present invention and a matrix resin, wherein the amount of the pitch-based carbon short fiber mixture is 3 to 60 vol % of the total.

According to the present invention, in the fourth place, the above objects and advantages of the present invention are attained by a radiator plate for electronic parts or a heat exchanger having the above carbon fiber reinforced resin molded product.

BEST MODE FOR CARRYING OUT THE INVENTION

A description is first given of the pitch-based carbon fibers used in the pitch-based carbon short fiber mixture of the present invention. The pitch-based carbon short fibers are preferably obtained from a condensation polycyclic hydrocarbon compound such as naphthalene or phenanthrene or a condensation heterocyclic compound such as petroleum pitch or coal pitch. Out of these, a condensation polycyclic hydrocarbon compound such as naphthalene or phenanthrene is more preferred, and optically anisotropic pitch, that is, mesophase pitch is particularly preferred. They may be used alone or in combination of two or more. It is desired that mesophase pitch should be used alone to improve the thermal conductivity of the carbon short fibers.

The softening point of the raw material pitch can be obtained by a Mettler method and is preferably 250° C. to 350° C. When the softening point is lower than 250° C., fusion bonding between fibers or large thermal shrinkage occurs during stabilization. When the softening point is higher than 350° C., the thermal decomposition of the pitch occurs, whereby the pitch hardly becomes fibrous.

The raw material pitch is spun by a melt blow method and then stabilized, baked, milled, sieved and graphitized to become a pitch-based carbon short fiber filler. Each step will be described hereinbelow.

Although a spinning nozzle for pitch fibers which are the raw material of the pitch-based carbon short fibers is not limited to a particular shape, a nozzle having a ratio of the length of the nozzle hole to the diameter of the hole of preferably less than 3, more preferably less than 1.5 is used. The temperature of the nozzle at the time of spinning is not particularly limited and may be a temperature at which a stable spinning state can be maintained, that is, the viscosity of the pitch to be spun becomes 2 to 80 Pa·S, preferably 5 to 30 Pa·S.

The pitch fibers spun from the nozzle hole are changed into short fibers by blowing a gas heated at 100 to 350° C. and having a linear velocity of 100 to 10,000 m/min to a position near a thinning point. The gas to be blown is, for example, air, nitrogen or argon, preferably air from the viewpoint of cost performance.

The pitch fibers are captured on a metal net belt to become a continuous web which is then crosslapped to become a web having a certain weight.

The thus obtained web composed of the pitch fibers is stabilized by a known method and baked at 700 to 900° C. Stabilization is carried out at 200 to 350° C. by using air or a gas obtained by adding ozone, nitrogen dioxide, nitrogen, oxygen, iodine or bromine to air. It is desirably carried out in the air when safety and convenience are taken into consideration. The stabilized pitch fibers are baked in vacuum or an inert gas such as nitrogen, argon or krypton. They are preferably baked under normal pressure in inexpensive nitrogen.

The web of the pitch fibers which has been baked is milled and sieved to obtain short fibers. For milling, a mill such as a Victory mill, jet mill or high-speed rotary mill and a cutter may be used. To mill the web efficiently, a method for cutting fibers in a direction perpendicular to their axes by turning a rotor having a blade at a high speed is suitable. The average length of carbon fibers obtained by milling can be controlled by adjusting the revolution of the rotor and the angle of the blade. Further, the carbon fibers are sieved to obtain fibers having a length of preferably 20 to 6,000 μm, more preferably 20 to 1,000 μm, much more preferably 50 to 500 μm. The above size can be achieved by combining sieves with different meshes of different sieves.

The pitch-based carbon short fibers used in the present invention are graphitized by heating the pitch fibers which have been sieved out and baked at 2,300 to 3,500° C. Graphitization is carried out in a non-oxidizing atmosphere.

A description is subsequently given of the shape of each pitch-based carbon short fiber used in the present invention. Although the length of the pitch-based carbon short fiber is determined by the above sieving, the fiber diameter and the dispersion of fiber diameters are almost nonequivocally determined by the spinning step. The fiber diameter of the pitch-based carbon short fiber is 1 to 2 μm smaller than the fiber diameter of gray yarn when it is spun. Meanwhile, CV which is the ratio of the degree of filament diameter distribution to average fiber diameter is defined by the following equation and directly reflects the value of gray yarn manufactured by a melt blow method.

$$CV = \frac{S_1}{\overline{D_1}}$$

wherein $S_1$ is the degree of filament diameter distribution and $\overline{D_1}$ is an average fiber diameter.

$S_1$ is obtained from the following equation.

$$S_1 = \sqrt{\frac{\sum_i (D - \overline{D_i})^2}{n^2}}$$

wherein D is the fiber diameter of each of an "n" number of fibers, $\overline{D_1}$ is the average value of the "n" number of fiber diameters, and n is the number of fibers.

In the present invention, the pitch-based carbon short fibers are obtained as a mixture of first pitch-based carbon short fibers having an average fiber diameter of 5 μm or more and less than 10 μm and a CV of 0.05 to 0.02 and second pitch-based carbon short fibers having an average fiber diameter of 10 to 20 μm and a CV of 0.05 to 0.2.

When a mixture of two different types of pitch-based carbon short fibers having different average fiber diameters is used, the packing rate of the carbon short fibers can be improved at the time of manufacturing a molded product as described above. A mixture obtained by mixing together short fibers having an average fiber diameter of 5 μm or more and less than 10 μm, preferably 6 to 9 μm and short fibers having an average fiber diameter of 10 to 20 μm, preferably 11 to 16 μm is suitable for improving the thermal conductivity of a molded product. When the average fiber diameter is smaller than 5 μm, a web formed right after spinning cannot maintain its form with the result of low productivity. When the average fiber diameter is larger than 20 μm, although the web form has no problem, as the diameter of the gray yarn is 21 to 22 μm, nonuniformity tends to occur in stabilization and the ratio of fibers fusion bonded to each other after baking rises with the result that fibers having a large diameter are readily produced disadvantageously. Fibers having a CV of less than 5% are not preferred for the improvement of the packing rate because the randomness of fiber diameter becomes small. Fibers having a CV of more than 20% are not preferred because the number of large fibers which become a problem in stabilization becomes too large. The CV is preferably 7 to 15%, more preferably 7 to 12%.

The mixing ratio of the first and second pitch-based carbon short fibers may be 1:99 to 99:1 but preferably 10:90 to 90:10 in terms of weight.

The first and second pitch-based carbon short fibers have a true density which greatly depends on graphitization temperature of preferably 1.5 to 2.5 g/cc. The true density is more preferably 1.6 to 2.5 g/cc. The first and second pitch-based carbon short fibers have a thermal conductivity in the fiber axial direction of preferably 200 W/(m·K) or more, more preferably 300 W/(m·K) or more.

At least one of the first pitch-based carbon short fibers and the second pitch-based carbon short fibers has a crystallite size in a hexagonal net plane direction of preferably 5 nm or more. The size of the crystallite derived from the growth direction of the hexagonal net plane can be obtained by a known method, that is, from a diffraction line from the (110) face of a carbon crystal obtained by an X-ray diffraction method. The reason that the size of the crystallite is important is that mainly a phonon conducts heat and a crystal transforms the phonon. The size of the crystallite is more preferably 20 nm or more, much more preferably 30 nm or more.

After the first and second pitch-based carbon short fibers are surface treated, they may be impregnated with 0.1 to 15 wt %, preferably 0.4 to 7.5 wt % of a sizing agent in term of the weight of short fibers. Any commonly used sizing agent may be used, as exemplified by epoxy compounds, water-soluble polyamide compounds, saturated polyesters, unsaturated polyesters, vinyl acetate, water, alcohols and glycols which may be used alone or in combination.

A description is subsequently given of the carbon fiber reinforced resin molded product of the present invention.

A known method may be used to manufacture the molded product by mixing the above pitch-based carbon short fiber mixture of the present invention with a matrix resin.

The matrix resin may be a thermosetting resin, a thermoplastic resin or a thermoplastic elastomer resin.

A polycarbonate, polyethylene terephthalate, polyethylene-2,6-naphthalene dicarboxylate, polyamide, polypropylene, polyethylene, polyepoxy ether ketone, polyphenylene sulfide or copolymer of each of these polymers may be used as the thermoplastic resin. Specific examples of the thermoplastic resin include polyethylene, polypropylene, ethylene-α-olefin copolymers such as ethylene-propylene copolymer, polymethylpentene, polyvinyl chloride, polyvinylidene chloride, polyvinyl acetate, ethylene-vinyl acetate copolymer, polyvinyl alcohol, polyacetal, fluororesin (such as polyvinylene fluoride or polytetrafluoroethylene), polyethylene terephthalate, polybutylene terephthalate, polyethylene naphthalate, polystyrene, polyacrylonitrile, styrene-acrylonitrile copolymer, ABS resin, polyphenylene ether (PPE) resin, modified PPE resin, aliphatic polyamide, aromatic polyamide, polyimide, polyamide-imide, polymethacrylic acid (polymethacrylate such as methyl polymethacrylate), polyacrylic acid, polycarbonate, polyphenylene sulfide, polysulfone, polyether sulfone, polyether nitrile, polyether ketone, polyketone, liquid crystal polymer and ionomer. These thermoplastic resins may be used alone or in combination of two or more. A polymer alloy of two or more thermoplastic resins may also be used.

The thermoplastic elastomer resin is preferably a polyester elastomer which is preferably a block copolymer composed of a hard segment and a soft segment. The melting point of the polyester elastomer is preferably 180 to 230° C., more preferably 190 to 210° C. The preferred elastic modulus of the polyester elastomer is 1,000 MPa or less. Commercially available products of the thermoplastic polyester-based elastomer resin include TR-EKV, B4032AT, B4063AC and P4140DT of Teijin Chemicals Ltd. Out of these, P4140DT and B4032AT whose water absorptivity is suppressed are preferred.

To improve the stability of the thermoplastic polyester-based elastomer resin, a stabilizer may be added.

Examples of the thermosetting resin include epoxy resin, phenolic resin, silicone resin, polyurethane resin, polyimide resin, thermosetting polyphenylene ether resin and thermosetting modified polyphenylene ether resin. They may be used alone or in combination of two or more. Further, a mixture of a thermoplastic resin and a thermosetting resin may be used as the matrix resin in order to develop desired physical properties from a carbon fiber reinforced plastic molded product. To mix the pitch-based carbon short fiber mixture with the matrix resin, a mixer or kneader such as a mixer, blender, roll or extruder may be used. To form a molded product, injection molding, press molding, calendar molding, extrusion molding, cast molding or blow molding may be employed.

The volume fraction of the pitch-based carbon short fiber mixture in the carbon fiber reinforced resin molded product formed by mixing the pitch-based carbon short fiber mixture with the matrix resin is preferably 3 to 60 vol %. It is more preferably 5 to 50 vol. %. When the volume fraction is smaller than 3 vol %, a route for thermal conduction is hardly formed and the addition of carbon fibers becomes meaningless. When the volume fraction is larger than 60 vol %, a phenomenon called "powder fall" that the carbon fibers fall off from the molded product occurs, thereby reducing the quality of the molded product.

The carbon fiber reinforced resin molded product of the present invention preferably has a high thermal conductivity as a molded product but its thermal conductivity calculated from thermal diffusion to the front and the rear is preferably 1 W/(m·K) or more, more preferably 2 W/(m·K) or more, much more preferably 5 W/(m·K) or more.

The carbon fiber reinforced plastic molded product of the present invention can be used as a radiator plate for electronic parts or a part of a heat exchanger. More specifically, it may be formed into a radiator plate, semiconductor package part, heat sink, heat spreader, die pad, printed wiring board, cooling fan part, heat pipe or housing to be used.

A description is subsequently given of the carbon fiber web containing pitch-based carbon short fibers of the present invention.

The raw material of the carbon fibers constituting the pitch-based carbon fiber web used in the present invention may be the same as the raw material used for the manufacture of the pitch-based carbon short fibers of the above-described pitch-based carbon short fiber mixture. The raw material pitch is spun by the melt blow method and then, stabilized and baked to become 3-D random web-like carbon fibers. Each of the above steps will be described hereinbelow.

Pitch fibers obtained by spinning the raw material pitch under the same spinning conditions as those for the above mixture are captured on a metal net belt to become a continuous web having a 3-D random shape which can be further crosslapped advantageously.

The pitch fiber web having a 3-D random shape obtained as described above is stabilized by a known method and baked at 1,00 to 3,500° C. to become a pitch-based carbon fiber web having a 3-D random shape.

Stabilization is carried out at 200 to 350° C. by using air or a gas obtained by adding ozone, nitrogen dioxide, nitrogen, oxygen, iodine or bromine to air. It is desirably carried out in the air when safety and convenience are taken into consideration. The stabilized pitch fibers are baked in vacuum or an inert gas such as nitrogen, argon or krypton. They are preferably baked under normal pressure in inexpensive nitrogen. The baking temperature is preferably 2,300 to 3,500° C., more preferably 2,500 to 3,500° C. in order to increase the thermal conductivity of the carbon fibers. Baking in a graphite vessel is preferred because a physical or chemical function from the outside can be shut off. The graphite vessel is not limited to a particular size or shape if it can contain a predetermined amount of the pitch fiber web which has been stabilized. However, it preferably has a lid to achieve high airtightness in order to prevent the damage of the pitch-based carbon fiber web due to a reaction with an oxidizing gas or carbon steam in a furnace during baking or cooling.

In the thus obtained pitch-based carbon fiber web, the carbon fibers constituting the fiber web are formed in such a manner that they are distributed at random three-dimensionally in the space defining the web. Since the pitch-based carbon fiber web has this structure, the obtained carbon fiber reinforced composite material shows the tendency that it conducts heat equally in all directions, which is preferred to attain the object of the present invention. When a carbon fiber reinforced composite material is manufactured by using a carbon fiber bundle (UD material) in which fibers are aligned in a specific direction, it is apt to conduct heat in the specific direction but hardly conducts heat in other directions.

It is desired that the carbon fibers constituting the pitch-based carbon fiber web have a crystallite size in the hexagonal net plane direction of 5 nm or more. The size of the crystallite derived from the growth direction of the hexagonal net plane can be obtained by a known method, that is, from a diffraction line from the (110) face of a carbon crystal obtained by an X-ray diffraction method. The reason that the size of the crystallite is important is that mainly a phonon conducts heat and a crystal transforms the phonon. The size of the crystallite is more preferably 20 nm or more, much more preferably 30 nm or more.

The carbon fibers constituting the pitch-based carbon fiber web preferably have a fiber diameter of 1 to 20 μm. When the fiber diameter is smaller than 1 μm, the shape of the web may not be maintained with the result of low productivity. When the fiber diameter is larger than 20 μm, nonuniformity in the stabilizing step becomes large and fusion bonding occurs partially. It is more preferably 3 to 17 μm, much more preferably 5 to 15 μm. The CV value is preferably 0.2 or less. It is more preferably 0.17 or less. When the CV value is larger than 0.2, the change of the shape may occur at the time of baking disadvantageously.

The carbon fibers constituting the pitch-based carbon fiber web preferably have a fiber length of 0.01 to 1,000 mm. When the fiber length is smaller than 0.01 mm, it is difficult to handle the fibers. When the fiber length is larger than 1,000 mm, the number of the interlaced fibers increases significantly, thereby making it difficult to handle them. The fiber length is more preferably 1 to 900 mm, much more preferably 10 to 800 mm.

The raw material of the carbon short fibers used in combination with the pitch-based carbon short fibers in the present invention may be a condensation heterocyclic compound which is the same as the raw material described above of the pitch-based carbon fiber web.

For the manufacture of the pitch-based carbon short fibers, they may be obtained by milling pitch-based carbon fibers obtained by a conventionally known manufacturing method, or the above pitch-based carbon fiber web.

Although the milling method is not particularly limited, a mill such as a Victory mill, jet mill or high-speed rotary mill and a cutter may be used. To mill the pitch-based carbon fiber webs efficiently, a method for cutting the fibers in a direction perpendicular to their axes by turning a rotor having a blade at a high speed is suitable. The average length of carbon fibers obtained by milling is controlled by adjusting the revolution of the rotor and the angle of the blade. Further, the carbon fibers are sieved to obtain fibers having a length of preferably 20 to 6,000 μm, more preferably 30 to 4,000 much more preferably 50 to 2,000 μm. The above size can be achieved by combining different meshes of different sieves. The fibers which have been sieved out may be further heated at 2,300 to 3,500° C. to be graphitized as final carbon short fibers.

A description is subsequently given of the shape of each of the pitch-based carbon short fibers. Although the length of the pitch-based carbon short fiber is determined by the above sieving, the average fiber diameter and the degree of filament diameter distribution are almost nonequivocally determined by the spinning step. The fiber diameter of the pitch-based carbon short fiber is 1 to 2 μm smaller than the fiber diameter of gray yarn when it is spun. Meanwhile, the CV value directly reflects the value of the gray yarn when it is spun. The carbon short fibers used in the present invention must have an average fiber diameter of 1 to 20 μm and a CV of 0.05 to 0.2.

When the average fiber diameter is smaller than 1 μm, the shape of the web may not be maintained with the result of low productivity. When the average fiber diameter is larger than 20 μm, nonuniformity in the stabilizing step becomes large and fusion bonding occurs partially. It is more preferably 3 to 17 μm, much more preferably 5 to 15 μm. The CV value is preferably 0.2 or less. It is more preferably 0.17 or less. When the CV value is larger than 0.2, the change of the shape may occur at the time of baking disadvantageously.

The mixing ratio of the pitch-based carbon fiber web to the pitch-based carbon short fibers is 30:70 to 95:5, preferably 50:50 to 90:10 in terms of weight. When the mixing ratio of the pitch-based carbon fiber web is lower than 30 wt %, the thermal conductivity in the thickness direction is not obtained fully and when the mixing ratio is higher than 95 wt %, the packing rate cannot be raised disadvantageously.

The true density of the pitch-based carbon fiber web which greatly depends on the baking temperature is preferably 1.5 to 2.5 g/cc, more preferably 1.6 to 2.5 g/cc. The thermal conductivity in the fiber axial direction of the pitch-based carbon fibers constituting the pitch-based carbon fiber web is preferably 200 W/(m·K) or more, more preferably 300 W/(m·K) or more.

The preferred embodiments (i), (ii) and (iii) of the present invention are given below.

(i) The carbon fibers constituting the pitch-based carbon fiber web have an average fiber diameter of 1 to 20 μm and a ratio of the degree of filament diameter distribution to average fiber diameter of 0.05 to 0.2.

(ii) The carbon fibers constituting the pitch-based carbon fiber web and the pitch-based carbon short fibers have a true density of 1.5 to 2.5 g/cc.

(iii) The carbon fibers constituting the pitch-based carbon fiber web and the pitch-based carbon short fibers have a thermal conductivity of 200 W/(m·K) or more.

A carbon fiber reinforced composite material can be obtained by impregnating the above carbon fiber web containing pitch-based carbon short fibers of the present invention (may be referred to as "pitch-based short fiber reinforcement" hereinafter) with a matrix resin.

The matrix resin is not particularly limited, and a thermosetting resin, a thermoplastic resin or a thermoplastic elastomer may be used, out of which a thermoplastic resin is preferred from the viewpoints of the degree of shape freedom and productivity.

Examples of the above substances are the same as those listed for the above carbon fiber reinforced resin molded product.

The content of the pitch-based carbon fiber reinforcement in the above carbon fiber reinforced composite material is preferably 3 to 60 vol %, more preferably 5 to 50 vol %. When the content of the pitch-based carbon fiber reinforcement is lower than 3 vol %, a desired thermal conductivity cannot be obtained and when the content is higher than 60 vol %, molding becomes extremely difficult disadvantageously.

Although the carbon fiber reinforced composite material preferably has a high thermal conductivity as a composite material, its thermal conductivity calculated from thermal diffusion to the front and the rear is 1 W/(m·K) or more. It is preferably 2 W/(m·K) or more, more preferably 5 W/(m·K) or more.

The above carbon fiber reinforced composite material is advantageously obtained by dispersing the pitch-based carbon short fibers into the pitch-based carbon fiber web or the matrix resin and then impregnating the pitch-based carbon fiber web with the matrix resin.

The pitch-based carbon fiber web, the pitch-based carbon short fibers and the matrix resin are identical to those described above.

The method of dispersing the pitch-based carbon short fibers into the pitch-based carbon fiber web is not particularly limited. The pitch-based carbon short fibers are dry blended with the pitch-based carbon fiber web, or the carbon short fibers are dispersed into a solvent, the pitch-based carbon fiber web is immersed in the solvent, and then the solvent is removed.

The method of dispersing the carbon short fibers into the matrix resin is not particularly limited. When the matrix resin is liquid at normal temperature, it can be mixed by means of a kneader such as a mixer. When the matrix resin is solid at normal temperature, it is heated to be molten and then mixed by means of a kneader such as a double-screw extruder.

The molding method for obtaining the carbon fiber reinforced composite material is not particularly limited, and injection molding, press molding, calender molding, extrusion molding, cast molding or blow molding may be used. The following methods may also be used to obtain the carbon fiber reinforced composite material.

As the first method, the carbon short fibers are dispersed into the matrix resin by the above method, and the matrix resin containing the carbon short fibers dispersed therein is introduced into the pitch-based carbon fiber web.

When the matrix resin is liquid at normal temperature, it is introduced into the pitch-based carbon fiber web fed into a metal mold in advance by RIM or RTM and cured to obtain the carbon fiber reinforced composite material.

When the matrix resin is solid at normal temperature, after the carbon short fibers are dispersed into the matrix resin by the above method, the pitch-based carbon fiber web fed into the mold in advance is injection molded to obtain the carbon fiber reinforced composite material.

The matrix resin containing the carbon short fibers dispersed therein is formed into a sheet, and so on, which is then laminated with the pitch-based carbon fiber web, and the resulting laminate is press molded to obtain the carbon fiber reinforced composite material.

Press molding is preferably carried out in vacuum in order to suppress the formation of voids.

As the second method, the carbon short fibers are dispersed into the pitch-based carbon fiber web by the above method and then the matrix resin is introduced into the pitch-based carbon fiber web.

When the matrix resin is liquid at normal temperature, it is introduced into the pitch-based carbon fiber web containing the carbon short fibers dispersed therein and fed into a metal mold in advance by RIM or RTM and cured to obtain the carbon fiber reinforced composite material.

When the matrix resin is solid at normal temperature, the pitch-based carbon fiber web containing the carbon short fibers dispersed therein and fed into the metal mold in advance is injection molded to obtain the carbon fiber reinforced composite material.

The matrix resin is formed into a sheet, and so on, which is then laminated with the pitch-based carbon fiber web containing the carbon short fibers dispersed therein, and the resulting laminate is press molded to obtain the carbon fiber reinforced composite material.

Press molding is preferably carried out in vacuum in order to suppress the formation of voids.

After the pitch-based carbon fiber web and/or the carbon short fibers are surface treated, they may be adhered with a sizing agent.

As for the surface treatment method, the surface may be modified by oxidation such as electrolytic oxidation or treatment with a coupling agent or a sizing agent. A metal or ceramic may be coated on the surface by physical deposition such as electroless plating, electrolytic plating, vacuum deposition, sputtering or ion plating, chemical deposition, coating, immersion or mechanochemical process for fixing fine particles mechanically.

The sizing agent is used in an amount of preferably 0.1 to 15 wt %, more preferably 0.4 to 7.5 wt % based on the pitch-based carbon fiber web and/or carbon short fibers. Any commonly used sizing agent may be used, as exemplified by an epoxy compound, water-soluble polyamide compound, saturated polyester, unsaturated polyester, vinyl acetate, water, alcohol and glycol which may be used alone or in combination.

The above carbon fiber reinforced composite material is preferably used in a radiator plate for electronic parts or a heat exchanger.

More specifically, it is molded into a radiator plate, semiconductor package part, heat sink, heat spreader, die pad, printed wiring board, cooling fan part, heat pipe or housing as a radiator member, heat conducting member or a constituent material thereof for diffusing heat generated from an electronic part such as semiconductor device, power source or light source to the outside effectively.

Although the thermal conductivity of a carbon fiber composite sheet can be measured by a known method, it is preferably measured by a laser flash method as the present invention is aimed to improve the thermal conductivity in the thickness direction of the carbon fiber composite sheet. In the laser flash method, specific heat capacity $C_p$ (J/gK) and thermal diffusivity $\alpha$ (cm$^2$/sec) are measured, thermal conductivity $\lambda$ (W/cmK) is obtained from density $\rho$ (g/cc) measured separately based on the equation $\lambda=\alpha \cdot Cp \cdot \rho$, and the unit can be changed. In general, the thermal conductivity of the carbon fiber itself is several hundreds of W/(m·K) but when it is molded into a molded product, its thermal conductivity sharply drops due to the generation of defects, the inclusion of air and the unexpected formation of voids. Therefore, it is said that the thermal conductivity of the carbon fiber composite sheet hardly exceeds 1 W/(m·K) substantially. However, in the present invention, this is solved by using the carbon fiber web, and the thermal conductivity of the carbon fiber composite sheet is increased to 1 W/(m·K) or more. It is more preferably 2 W/(m·K) or more, much more preferably 5 W/(m·K) or more.

The carbon fiber reinforced composite material obtained as described above can be advantageously used for thermal management.

EXAMPLES

The following examples are provided but are in no way to be taken as limiting. The following items (1) to (6) are applied to the pitch-based carbon short fiber mixture and a molded product obtained from the mixture.
(1) The average fiber diameter and degree of filament diameter distribution of the pitch-based carbon short fibers were obtained by taking photos of 10 different view fields of the graphitized fibers with a scanning electron microscope at a magnification of 800.
(2) The thermal conductivity of each carbon fiber was obtained from the following equation indicating the relationship between thermal conductivity and electric resistivity disclosed by JP-A 11-117143 by measuring the resistivity of yarn after baking:

$$K=1272.4/ER-49.4 \quad (1)$$

wherein K is the thermal conductivity W/(m·K) of the carbon fiber and ER is the electric resistivity $\mu\Omega m$ of the carbon fiber.
(3) The thermal conductivity of the molded product was obtained by the laser flash method (using LFA447 of NETZCH Co., Ltd.) using a carbon fiber reinforced plastic molded sheet having a thickness of 1 mm as a sample.
(4) The density of the pitch-based carbon short fibers was obtained by a gravity method.
(5) Injection molding was used.
(6) The crystal size of the carbon fiber was obtained by measuring reflection from the (110) face which appears in X-ray diffraction in accordance with a GAKUSHIN method.

The following items (7) to (9) and the above (2) and (6) are applied to the carbon fiber web and a molded product obtained from the fiber web.
(7) The diameter of the 3-D random web-like carbon fiber was obtained by extracting arbitrary 10 fields of view of the fiber and taking photos of the view fields of the fiber after baking with a scanning electron microscope at a magnification of 800.
(8) The length of the 3-D random web-like carbon fiber was measured with a length meter by extracting a fiber after baking.

Example 1

Pitch composed of a condensation polycyclic hydrocarbon compound was used as the main raw material. The ratio of the optical anisotropy of this pitch was 100% and its softening point was 285° C. A cap having a hole with a diameter of 0.2 mm was used, and heated air was ejected from a slit at a linear velocity of 5,000 m/min to draw the molten pitch so as to manufacture pitch-based short fibers having an average diameter of 10 μm. The spun fibers were collected on a belt to obtain a web which was then crosslapped to manufacture a web of pitch-based short fibers having a weight of 250 g/m².

This web was heated in the air from 170 to 295° C. at an average temperature elevation rate of 7° C./min to be stabilized. The stabilized web was baked at 800° C. and milled, and fibers having a length of 50 to 500 μm were sieved out. Thereafter, the fibers were heated up to 3,000° C. in an Acheson furnace in a nonoxidizing atmosphere to be graphitized. The fibers had an average fiber diameter of 8.5 μm and a CV of 15%. The fibers were designated as pitch-based carbon short fibers A. They had a thermal conductivity of 480 W/(m·K).

Pitch-based short fibers having an average fiber diameter of 13 μm were manufactured similarly by drawing the molten pitch. The spun fibers were collected on a belt to obtain a web which was then crosslapped to manufacture a web of pitch-based short fibers having a weight of 300 g/m². This web was heated in the air from 170 to 295° C. at an average temperature elevation rate of 5° C./min to be stabilized. The stabilized web was baked at 800° C. and milled, and fibers having a length of 50 to 500 μm were sieved out. Thereafter, the fibers were heated up to 3,000° C. in an Acheson furnace in a non-oxidizing atmosphere to be graphitized. The fibers had an average fiber diameter of 11.5 μm and a CV of 13%. They were designated as pitch-based carbon short fibers B. They had a thermal conductivity of 480 W/(m·K).

The pitch-based carbon short fibers A and B were mixed together in a weight ratio of 50:50 to manufacture a pitch-based carbon short fiber mixture. The density of the mixture was 2.0 g/cc.

This mixture was added to a polycarbonate resin in a volume ratio of 30%, and the resulting mixture was injection molded into a flat plate. The thermal conductivity in the thickness direction of the flat plate was 1.5 W/(m·K).

Example 2

A pitch-based carbon short fiber mixture was manufactured by mixing together the carbon short fibers A and B obtained in Example 1 in a weight ratio of 30:70 and added to a polycarbonate resin in a volume ratio of 30%, and the resulting mixture was injection molded into a flat plate. The density of the mixture was 2.0 g/cc and the thermal conductivity in the thickness direction of the flat plate was 1.7 W/(m·K).

Example 3

A pitch-based carbon short fiber mixture was manufactured by mixing together the carbon short fibers A and B obtained in Example 1 in a weight ratio of 70:30 and added to a polycarbonate resin in a volume ratio of 30%, and the resulting mixture was injection molded into a flat plate. The density of the mixture was 2.0 g/cc and the thermal conductivity in the thickness direction of the flat plate was 1.6 W/(m·K).

Example 4

A pitch-based carbon short fiber mixture was manufactured by mixing together the carbon short fibers A and B obtained in Example 1 in a weight ratio of 50:50 and added to a polyphenylene sulfide resin in a volume ratio of 30%, and the resulting mixture was injection molded into a flat plate. The density of the mixture was 2.0 g/cc and the thermal conductivity in the thickness direction of the flat plate was 3.3 W/(m·K).

Example 5

A pitch-based carbon short fiber mixture was manufactured by mixing together the carbon short fibers A and B obtained in Example 1 in a weight ratio of 30:70 and added to a polyphenylene sulfide resin in a volume ratio of 30%, and the resulting mixture was injection molded into a flat plate. The density of the mixture was 2.0 g/cc and the thermal conductivity in the thickness direction of the flat plate was 3.5 W/(m·K).

Example 6

A pitch-based carbon short fiber mixture was manufactured by mixing together the carbon short fibers A and B obtained in Example 1 in a weight ratio of 70:30 and added to a polyphenylene sulfide resin in a volume ratio of 30%, and the resulting mixture was injection molded into a flat plate. The density of the mixture was 2.0 g/cc and the thermal conductivity in the thickness direction of the flat plate was 2.9 W/(m·K).

Comparative Example 1

Only the carbon short fibers A obtained in Example 1 were used as the pitch-based carbon short fibers and added to a polycarbonate resin in a volume ratio of 30%, and the resulting mixture was injection molded into a flat plate. The density of the carbon short fibers A was 2.0 g/cc and the thermal conductivity in the thickness direction of the flat plate was 0.8 W/(m·K).

Comparative Example 2

Only the carbon short fibers B obtained in Example 1 were used as the pitch-based carbon short fibers and added to a polyphenylene sulfide resin in a volume ratio of 30%, and the resulting mixture was injection molded into a flat plate. The density of the carbon short fibers B was 2.0 g/cc and the thermal conductivity in the thickness direction of the flat plate was 0.6 W/(m·K).

Example 7

When the flat plate manufactured in Example 1 was used in place of a housing made of a polycarbonate alone and a stainless block heated at 80° C. was placed as a heat source in a housing manufactured from the flat plate, it was confirmed that a rise in the inside temperature was suppressed.

Example 8

When the flat plate manufactured in Example 4 was used in place of a housing made of a polycarbonate alone and a stainless block heated at 80° C. was placed as a heat source in a housing manufactured from the flat plate, it was confirmed that a rise in the inside temperature was suppressed.

Example 9

Pitch composed of a condensation polycyclic hydrocarbon compound was used as the main raw material. The ratio of the optical anisotropy of this pitch was 100% and its softening point was 285° C. A cap having a hole with a diameter of 0.2 mm was used, and heated air was ejected from a slit at a linear velocity of 5,000 m/min to draw the molten pitch so as to manufacture pitch-based short fibers having an average diameter of 11 μm. The spun fibers were collected on a belt to obtain a web which was then crosslapped to manufacture a pitch fiber web having a 3-D random shape with a weight of 250 g/m$^2$.

This pitch fiber web was heated in the air from 170 to 300° C. at an average temperature elevation rate of 5° C./min to be stabilized. The stabilized pitch fiber web was baked at 3,000° C. to obtain a pitch-based carbon fiber web A having a 3-D random shape. The pitch-based carbon fibers constituting the pitch-based carbon fiber web A had an average fiber diameter of 9 μm and a CV of 18%. They had an average fiber length of 100 mm and a crystallite size of 46 nm. They had a thermal conductivity of 595 W/(m·K).

Part of the pitch fiber web which had been stabilized was baked at 700° C., formed into short fibers by a mill and further baked at 3,000° C. to obtain carbon short fibers B. The carbon short fibers B had a yarn average fiber diameter of 9 μm and a CV of 18%. They had an average fiber length of 0.5 mm.

50 parts by weight of the carbon short fibers B was used based on 100 parts by weight of the pitch-based carbon fiber web A and dry blended to be dispersed into the voids of the web A so as to obtain a pitch-based carbon fiber reinforcement.

A maleic acid-modified polypropylene film manufactured by Sanyo Chemical Industries, Ltd. was used as the matrix resin, the volume ratio of the pitch-based carbon fiber reinforcement to a molded product was set to 40%, and press molding was carried out by a vacuum press manufactured by Kitagawa Seiki Co., Ltd. using a metal mold having an inside measure of 650 mm to obtain a molded product having a thickness of 1 mm. When the thermal conductivity of the molded carbon fiber reinforced composite material was measured, it was 5.5 W/(m·K).

Example 10

Pitch composed of a condensation polycyclic hydrocarbon compound was used as the main raw material. The ratio of the optical anisotropy of this pitch was 100% and its softening point was 285° C. A cap having a hole with a diameter of 0.2 mm was used, and heated air was ejected from a slit at a linear velocity of 4,800 m/min to draw the molten pitch so as to manufacture pitch-based short fibers having an average diameter of 12 μm. The spun fibers were collected on a belt to obtain a web which was then crosslapped to manufacture a pitch fiber web having a 3-D random shape with a weight of 250 g/m$^2$.

This pitch fiber web was heated in the air from 170 to 300° C. at an average temperature elevation rate of 5° C./min to be stabilized. The stabilized pitch fiber web was baked at 3,000° C. to obtain a pitch-based carbon fiber web A having a 3-D random shape. The pitch-based carbon fibers constituting the pitch-based carbon fiber web A had an average fiber diameter of 10 μm and a CV of 19%. They had an average fiber length of 150 mm and a crystallite size of 47 nm. They had a thermal conductivity of 610 W/(m·K).

Part of the pitch fiber web which had been stabilized was baked at 700° C., formed into short fibers by a mill and further baked at 3,000° C. to obtain carbon short fibers B. The carbon short fibers B had an average fiber diameter of 10 μm and a CV of 19%. They had an average fiber length of 0.2 mm.

20 parts by weight of the carbon short fibers B was melt kneaded with 100 parts by weight of a polycarbonate resin manufactured by Teijin Chemical Ltd. as a matrix resin by a double-screw extruder having a die for forming a film, and then the kneaded product was formed into a film.

The polycarbonate film containing the carbon short fibers B obtained by the above method, a polycarbonate film manufactured by Teijin Chemical Ltd. and the pitch-based carbon fiber reinforcement were used, the weight ratio of the pitch-based carbon fiber web used as the pitch-based carbon fiber reinforcement to the carbon short fibers was set to 100:50 (parts by weight), the volume ratio of the carbon fiber reinforcement to a molded product was set to 45%, and press molding was carried out in a metal mold having an inner measure of 650 mm with a vacuum press manufactured by Kitagawa Seiki Co., Ltd. so as to obtain a molded product having a thickness of 1 mm. When the thermal conductivity of the molded carbon fiber reinforced composite material was measured, it was 6.1 W/(m·K).

Comparative Example 3

Pitch composed of a condensation polycyclic hydrocarbon compound was used as the main raw material. The ratio of the optical anisotropy of this pitch was 100% and its softening point was 285° C. A cap having a hole with a diameter of 0.2 mm was used, and heated air was ejected from a slit at a linear velocity of 5,000 m/min to draw the molten pitch so as to manufacture pitch-based short fibers having an average diameter of 10 μm. The spun fibers were collected on a belt to obtain a web which was then crosslapped to manufacture a pitch fiber web having a 3-D random shape with a weight of 250 g/m².

This pitch fiber web was heated in the air from 170 to 295° C. at an average temperature elevation rate of 7° C./min to be stabilized. The stabilized 3-D random web was baked at 800° C. The pitch-based carbon fibers constituting the pitch-based carbon fiber web after baking had an average fiber diameter of 9 μm and a CV of 18%. They had an average fiber length of 40 mm and a crystallite size of 3 nm. They had a thermal conductivity of 35 W/(m·K).

A maleic acid-modified polypropylene film manufactured by Sanyo Chemical Industries, Ltd. was used as a matrix resin, the volume ratio of the pitch-based carbon fiber reinforcement to a molded product was set to 30%, and press molding was carried out in a metal mold having an inner measure of 650 mm with a vacuum press manufactured by Kitagawa Seiki Co., Ltd. so as to obtain a molded product having a thickness of 1 mm. When the thermal conductivity of the molded carbon fiber reinforced composite material was measured, it was less than 1 W/(m·K).

Comparative Example 4

When its thermal conductivity was measured in the same manner as in Example 9 except that a maleic acid-modified polypropylene resin alone was molded in place of the carbon fiber reinforced composite material, it was less than 1 W/(m·K).

What is claimed is:

1. A carbon fiber web comprising a pitch-based carbon fiber web and pitch-based carbon short fibers having an average fiber diameter of 1 to 20 μm, a ratio of the degree of filament diameter distribution to average fiber diameter of 0.05 to 0.20 and a fiber length of 20 to 6,000 μm, wherein the pitch-based carbon short fibers are dispersed in the voids of the pitch-based carbon fiber web, and the weight ratio of the pitch-based carbon fiber web to the pitch-based carbon short fibers is 30:70 to 95:5.

2. The carbon fiber web according to claim 1, wherein carbon fibers constituting the pitch-based carbon fiber web are distributed at random three-dimensionally in a space defining the web.

3. The carbon fiber web according to claim 1, wherein carbon fibers constituting the pitch-based carbon fiber web have a crystallite size in the hexagonal net plane direction of 5 nm or more.

4. The carbon fiber web according to claim 1, wherein carbon fibers constituting the pitch-based carbon fiber web have an average fiber diameter of 1 to 20 μm and a ratio of the degree of filament diameter distribution to average fiber diameter of 0.05 to 0.2.

5. The carbon fiber web according to claim 1, wherein carbon fibers constituting the pitch-based carbon fiber web and the pitch-based carbon short fibers have a true density of 1.5 to 2.5 g/cc.

6. The carbon fiber web according to claim 1, wherein carbon fibers constituting the pitch-based carbon fiber web and the pitch-based carbon short fibers have a thermal conductivity of 200 W/(m·K) or more.

7. The carbon fiber web according to claim 2, wherein carbon fibers constituting the pitch-based carbon fiber web have a crystallite size in the hexagonal net plane direction of 5 nm or more.

8. The carbon fiber web according to claim 2, wherein carbon fibers constituting the pitch-based carbon fiber web have an average fiber diameter of 1 to 20 μm and a ratio of the degree of filament diameter distribution to average fiber diameter of 0.05 to 0.2.

9. The carbon fiber web according to claim 3, wherein carbon fibers constituting the pitch-based carbon fiber web have an average fiber diameter of 1 to 20 μm and a ratio of the degree of filament diameter distribution to average fiber diameter of 0.05 to 0.2.

10. The carbon fiber web according to claim 7, wherein carbon fibers constituting the pitch-based carbon fiber web have an average fiber diameter of 1 to 20 μm and a ratio of the degree of filament diameter distribution to average fiber diameter of 0.05 to 0.2.

* * * * *